United States Patent [19]

Huckins

[11] Patent Number: 5,055,276
[45] Date of Patent: Oct. 8, 1991

[54] CERAMIC WHISKER GROWING SYSTEM

[76] Inventor: Harold A. Huckins, 51 Finley Rd., Princeton, N.J. 08540

[21] Appl. No.: 437,020

[22] Filed: Nov. 15, 1989

[51] Int. Cl.$^5$ ............................................. B01J 8/00
[52] U.S. Cl. ................................... 422/191; 422/199; 422/210; 422/233; 422/254; 423/345; 156/DIG. 12; 219/10.57
[58] Field of Search .............. 422/191, 198, 199, 210, 422/232, 233, 245, 246, 254; 423/344, 345, 412; 219/10.57; 156/DIG. 99, DIG. 112

[56] References Cited

U.S. PATENT DOCUMENTS

| Re. 26,941 | 8/1970 | Lowe | 423/346 |
|---|---|---|---|
| 2,899,285 | 8/1959 | Carr | 422/219 |
| 3,300,195 | 1/1967 | Donovan et al. | 432/121 |
| 3,519,472 | 7/1970 | Cameron et al. | 156/609 |
| 3,721,732 | 3/1973 | Knippenberg et al. | 423/346 |
| 4,702,901 | 10/1987 | Shalek | 423/345 X |
| 4,789,536 | 12/1988 | Schramm | 423/345 |
| 4,900,525 | 2/1990 | D'Angelo et al. | 156/DIG. 112 X |

FOREIGN PATENT DOCUMENTS

| 57-111300 | 12/1980 | Japan . |
|---|---|---|
| 61-228000A | 3/1985 | Japan . |
| 62-003098A | 6/1985 | Japan . |
| 61-291496A | 6/1985 | Japan . |
| 62-087497A | 10/1985 | Japan . |
| 62-091499A | 10/1985 | Japan . |

OTHER PUBLICATIONS

"Silicon Carbide Whiskers", Dr. J. F. Rhodes, 88th Annual Meeting Abstracts, American Ceramic Society, Chicago, 1986.
"Whiskers", Handbook of Reinforcements for Plastics, Van Nostrand Reinhold Co., 1987.
"Asbestiform Fibers–Nonoccupational Health Risks", National Research Council, National Academy Press, 1984, pp. 1, 36.
"Growth of Beta–Silicon Carbide Whiskers by the VLS Process", Journal of Materials Science, 20 (1985) pp. 1160–1166.
"Synthesis and Characterization of VLS-Derived Silicon Carbide Whiskers", Whisker- and Fiber-Toughened Ceramics, Proceedings of an International Conference, ASM, 7–9 Jun. 1989, pp. 53–62.

Primary Examiner—Robert J. Warden
Assistant Examiner—Rebekah Griffith
Attorney, Agent, or Firm—Mathews, Woodbridge & Collins

[57] ABSTRACT

A whisker growing furnace having a plurality of removable reaction plates mounted therein. A whisker collecting apparatus removes the plates one at a time from the furnace without shutting down the furnace or stopping the whisker growing process. The whisker collection apparatus includes a whisker stripper for stripping the whiskers from the plate as the plate is removed from the furnace. The plate is then returned to the furnace for further processing as the plate is coated with fresh catalyst.

17 Claims, 4 Drawing Sheets

CERAMIC WHISKER GROWING SYSTEM

BACKGROUND OF THE INVENTION

1. Field of the Invention

This invention pertains to the field of ceramic whisker fabrication and, more particularly, to a furnace system for use in growing ceramic whiskers in a continuous process.

2. Description of the Prior Art

Interest in ceramic whiskers and fibers has increased enormously in recent years, as consumers of such products have sought out ever increasing taxing applications for ceramics, metals and plastics. These applications have involved the use of materials such as ceramics at higher temperatures and under increasing stresses. Under such conditions, monolithic ceramics have the tendency to suddenly fail, due to their brittle characteristics. Developers of ceramic products have found that the introduction of a second phase for reinforcement has been particularly effective in improving the fracture toughness of ceramics. Such products are called ceramic matrix composites. The reinforcing material can be either short fibers or whiskers, long fibers, or cloth-mats. Tests have shown that such reinforcements act as a means to disperse the hairline fault or crack that is the initiation of a fracture failure of a composite.

This principle of load distribution from a fiber is well known for both ceramic and polymeric matrix composites. It also applies for metal matrix composites in a similar manner. Ceramic whiskers can be used for reinforcement of all three matrix structures—ceramic, polymeric and metallic.

The use of fibers for reinforcement of composites is well understood. Whiskers are also fibers except their length to diameter ratio (aspect ratio) is much shorter—10:1 to 1000:1. Whiskers are typically thought to be 0.1 to 100 microns in diameter. Short fibers overlap the whisker-to-fiber region where the aspect ratio can approach infinity.

Ceramic whiskers are used today for reinforcement of alumina for cutting tools and wear parts, and with aluminum for some structural components in aircraft. The use of silicon carbide, a popular ceramic whisker, has greatly increased the life of cutting tools up to 100 times over that of tungsten carbide. It is also used to a lesser extent for wear parts and reinforcement in aluminum composites in aircraft components. It is believed that the total US market for silicon carbide whiskers is 50,000–100,000 pounds per year at $200–$600 per pound. Other whiskers, while of small volume, can very from $100 to $1000 per pound.

Long term, it is believed that reinforcement of ceramics could be the basis for large volume use of ceramics as it solves the inherent disadvantage of ceramics—its high potential for sudden brittle failure. Ceramic reinforcement can be the basis for ceramic use in military armour on tanks, vehicles, aircraft, etc., ceramic rotors, valves, cylinder liners and complete all-ceramic engines, reinforcement of tall buildings and even bridges, if its cost can be brought down to compete with steel. At a lower cost it can be equally useful in metallic and polymeric composites.

Many kinds of ceramic materials can be made into whiskers. They include silicon carbide, alumina or sapphire, silicon nitride, diamond, aluminum nitride, to name a few. Alumina or sapphire whiskers are particularly interesting as silicon carbide whisker compositions cannot be used for cutting ferrous metals because silicon carbide whiskers will react with the iron. This is unfortunate as the cutting of stainless steels and irons represent over 90% of all cutting tool needs.

Initial commercialization of ceramic whiskers or short fibers came about as a by-product of the electric furnace silicon carbide process before the turn of the century. Most early-produced whiskers were of such variable quality that they were not accepted in the market place.

Later, developers worked at perfecting a whisker growing process that pyrolyzed rice hulls as the feed stock. The pyrolysis of silica with carbon represents the most significant commercial process for ceramic whisker manufacture today. Two feedstocks are used for this process: rice hulls or finely divided silica, and carbon. Some SiC whiskers were made commercially for a brief time in the early 1970's starting with the same raw materials, but the processing was quite different.

The pyrolysis process was described by Dr. J. F. Rhodes in "Silicon Carbide Whiskers", 88th *Annual Meeting Abstracts*, American Ceramic Society, Chicago, 1986. Basically rice hulls, the by-product from rice hulling, which is high in silica, are first cooked to remove some volatile compounds. This material is then charged to a periodic (batch) furnace where it is heated to 1600° C. Under these pyrolysis conditions, silicon carbide whiskers will grow from the exposed surfaces of pyrolyzed material. The whisker growth will be irregular because of the nature of the surface upon which growth occurs and because the process is non-catalytic. The whiskers can also interlock and cluster.

Upon completion of the pyrolysis, the reactor mass is shredded, dispersed and then the whiskers are separated from the residual rice hulls, dried and the residual carbon burnt off. In this subsequent processing, some of the whiskers are damaged. Some residual ashes from the rice hulls and soil remain with the whiskers. In addition, the whiskers get tangled and clustered and some of the original hulls remain in the product. The nature of such processing leads to highly irregular whiskers, where clusters can substantially reduce the effectiveness of whiskers for their intended purpose of reinforcement of composites. There is a 10-30% physical loss of whiskers in this downstream processing.

An additional disadvantage to the conventional pyrolysis process is the fact that it produces very small diameter whiskers between 0.1–1.0 microns. It is generally recognized that whiskers in this size range with an aspect ratio of 10 or more to 1 can pass through the human air breathing system and become lodged in the lungs. It is also believed by most that these whiskers are inert to human fluids in the body, so that in time they can be the initiator of internal growth such as cancer as is the case with asbestos. While it has not been fully proven that such ceramic whiskers or short fibers are inert, producers of whiskers have assumed this to be the case so that they are employing procedures as if the ceramic whiskers are carcinogenic. Some manufacturers of ceramic whiskers will not sell whiskers by themselves. It is believed that, in part, this is because of its potential health hazard.

The alternate process for producing ceramic whiskers and fibers is to employ a catalyst to promote the growth of whiskers. In this latter case control over the whisker forming process is greatly improved. By the proper selection of the catalyst (usually a solid) together with its particle size, specific diameter whiskers can be produced. If all the catalyst particles are of the same size, then the whiskers will be all of the same diameter. This catalytic process is often described as the VLS process—vapor, liquid, solid. The feedstocks are introduced into the reactor as a vapor (V), they are liquified (L) on the surface of the catalyst (S). The whiskers proceed to grow off the liquid surface with a catalyst particle remaining at the outer tip of the whisker. This process is described in Chapter 13—"Whiskers", *Handbook of Reinforcements for Plastics*, Van Nostrand Reinhold Co. 1987, editors John V. Milewski and Harry S. Katz.

In addition to the inherent advantages of producing whiskers of high uniformity, by the proper selection of catalyst size, whiskers of larger diameter can be made. A study entitled "Asbestiform Fibers-Nonoccupational Health Risks" by the National Research Council, National Academy Press, 1984 pp. 1, 36, concluded that small fibers or whiskers less than approximately three microns in mean aerodynamic diameter can enter the human airways. If of sufficient length, they could lodge in the lungs. In the VLS process, to be described below, the minimum diameter itself will be far in excess of three microns mean aerodynamic diameters. The larger diameter whisker is also more useful for composite reinforcement.

In addition to the toxicological advantages of VLS whiskers, they are much stronger than whiskers made by the pyrolysis process. The incorporation of such whiskers into alumina matrix leads to higher fracture toughness of the resultant composite. Silicon carbide whiskers can also be useful for reinforcement of metallic and polymeric composites.

In spite of the very significant advantages for whiskers produced by the VLS process, it is not commercially practiced to any significant degree at this time primarily because the productivity with this technology is extraordinarily low. Recent manufacturers have produced VLS whiskers for a short period of time at a great cost and, consequently, could not find any continued market for long term usage.

Dr. John V. Milewski summarized the current state of the VLS process in "Growth of Beta-Silicon Carbide Whiskers by the VLS Process", *Journal of Materials Science* 20 (1985) pp. 1160–1166 and in his Chapter 13 on "Whiskers" in *Handbook of Reinforcements for Plastics* (cited above). Reference is made of depositing VLS whiskers upon a single moving belt or producing whiskers in a furnace where one or more silica bricks coated with carbon are used for the silicon monoxide source for silicon carbide whiskers. Other references refer to multiple single point sources for the SiO. Milewski also refers to the need for a vapor stream of SiO which, when combined with methane (CH4) can lead to the formation of SiC upon a molten supersaturated solution on the surface of carbon. From this supersaturated solution will grow the whisker with a catalyst particle at its tip. Such growth will lead to a uniform crystal of silicon carbide, if the level of impurities is low. Impurities in silica brick can end up in the SiC whisker product. It should be noted that in spite of many impurities in VLS whiskers, they are considerably purer than whiskers from the conventional pyrolysis processes. For many advanced or structural ceramic applications, high chemical purity materials are required in addition to excellent physical properties.

Shalek et al. in "Synthesis and Characterization of VLS-Derived Silicon Carbide Whiskers", *Whisker- and Fiber- Toughened Ceramics, Proceedings of an International Conference*, ASM, 7–9 June 1989, pp. 53–62 describes an in situ whisker generator process wherein a plurality of whisker growing plates are batch processed in a furnace. Shalek et al. lists many of the most critical process parameters that must be controlled to obtain uniform, reproducible yields of prime VLS whiskers. While the in situ processes of the type disclosed by Shalik et al. have served the purpose in producing prime whiskers, they have not proved commercially economical because the furnace throughput is low.

As such, those concerned with the development of whisker growing systems have long recognized that VLS whiskers are clearly superior to whiskers from non-catalytic pyrolysis processes, but suffer from low productivity per unit furnace volume. This leads to extraordinarily high capital investments and high operating costs per unit volume of whisker produced. The present invention overcomes these problems.

SUMMARY OF THE INVENTION

The general purpose of this invention is to provide a ceramic whisker growing system which embraces all of the advantages of similarly employed in situ batch systems for whisker growing and possesses none of the aforedescribed disadvantages. To attain this, the present invention contemplates a unique whisker growing furnace having a whisker collecting mechanism whereby the furnace throughput and, therefore, the productivity per unit of furnace volume are significantly increased.

More particularly, the present invention contemplates a whisker growing furnace having a plurality of removable reaction plates mounted therein. A whisker collecting apparatus is provided for individually removing the plates from the furnace without shutting down the furnace or stopping the process. The whisker collecting apparatus includes means for stripping the whiskers from the plate as the plate is removed from the furnace. The plate is then returned to the furnace for further processing.

An object of the present invention is the provision of a whisker growing furnace having a high productivity per unit volume at the required whisker growing temperature.

Another object of the present invention is to provide a VLS whisker growing furnace wherein whiskers are grown in situ.

A further object of the present invention is to provide an in situ whisker growing furnace for continuous operation to increase on-stream time in the furnace, to conserve heat and to conserve raw materials.

Still another object is to provide a whisker growing system that will produce uniform diameter and aspect ratio whiskers of the same chemical composition on a regular basis.

Other objects and many of the attendant advantages of this invention will be readily appreciated as the same becomes better understood by reference to the following detailed description when considered in connection with the accompanying drawings in which like reference characters designate like parts throughout the figures thereof.

DETAILED DESCRIPTION OF THE PREFERRED EMBODIMENT

Figure 1:
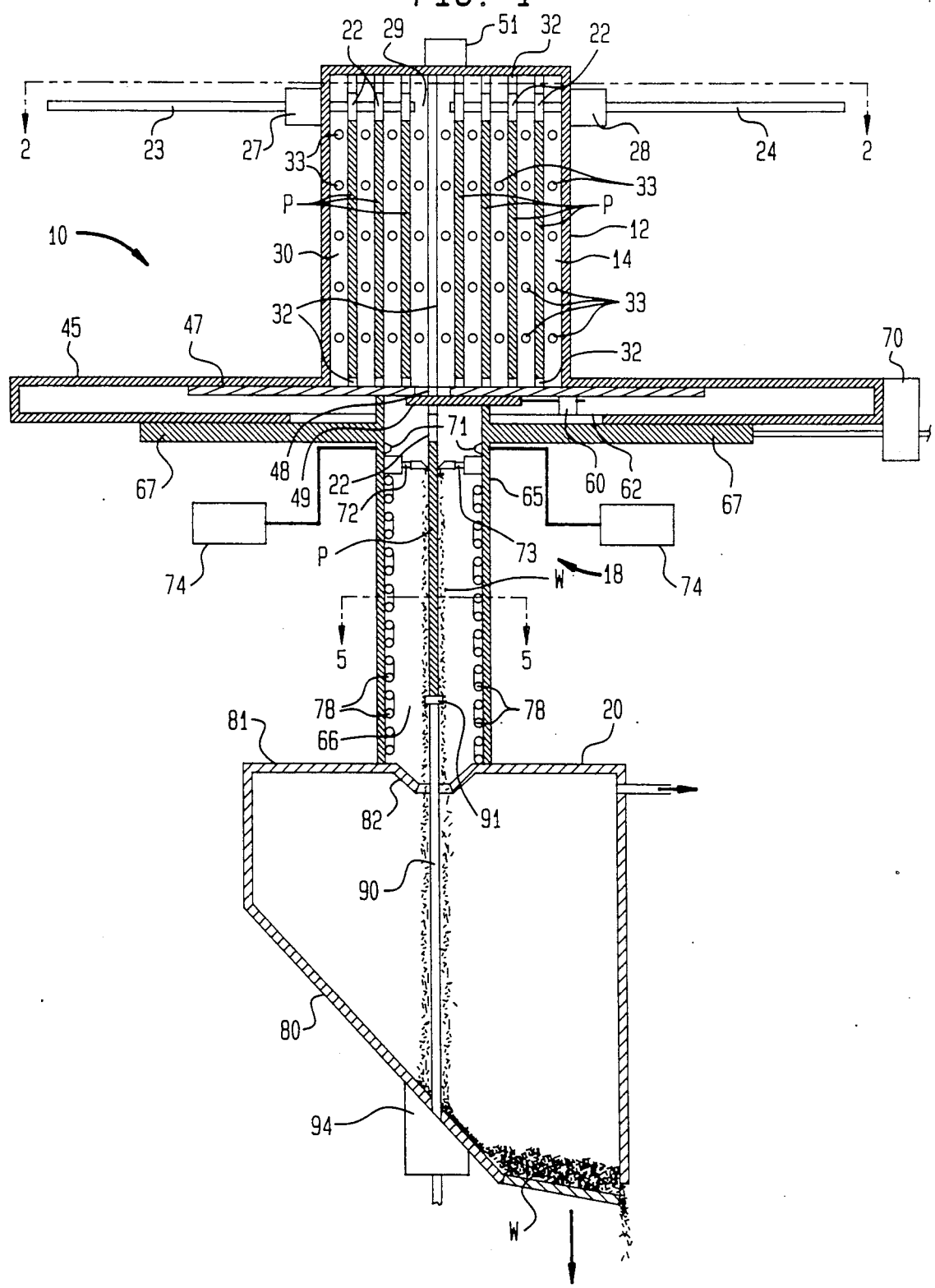
FIG. 1 is an elevation of the preferred embodiment of the invention shown in cross section in a plane defined by the line 1—1 of FIG. 2, looking in the direction of the arrows.
Figure 2:
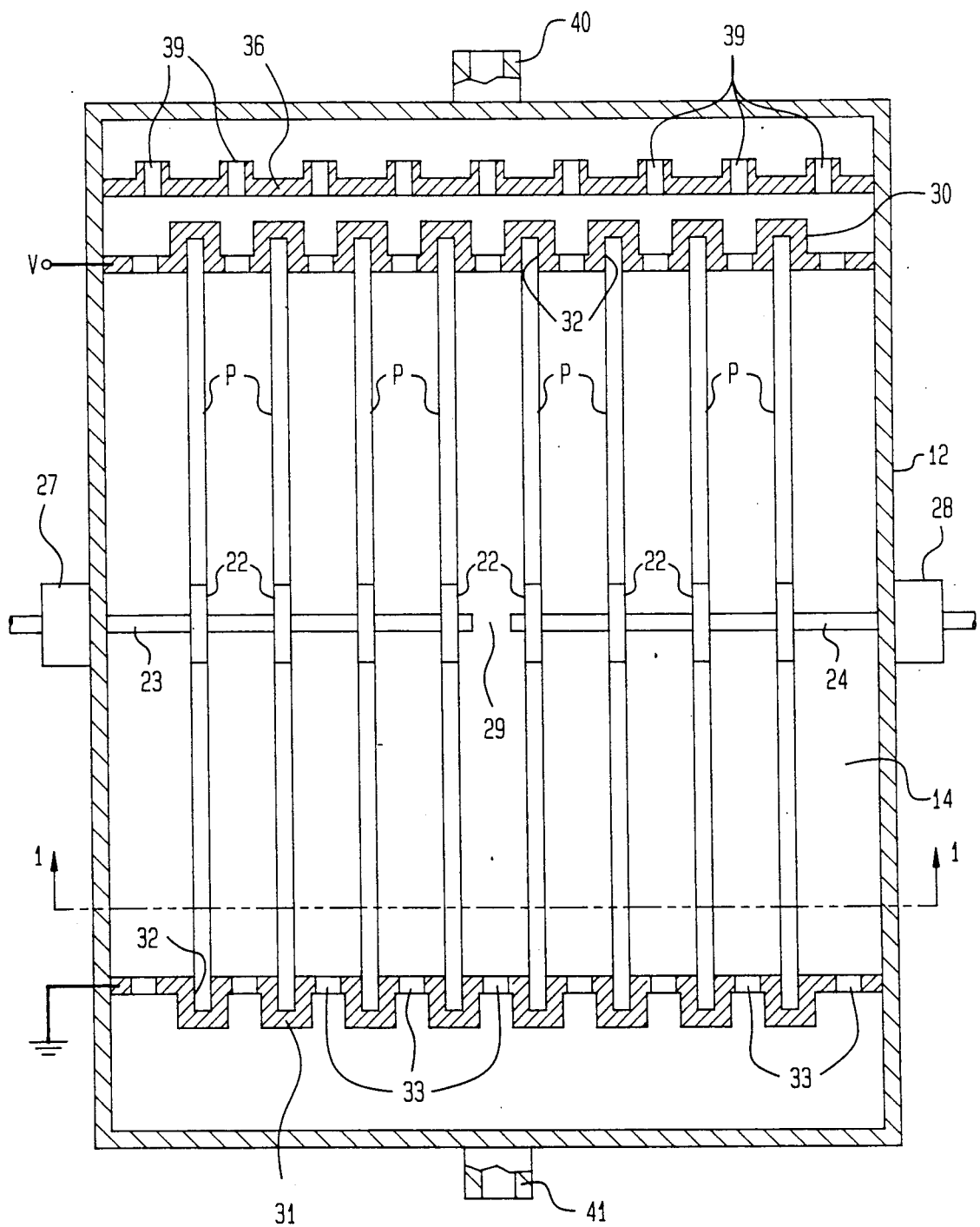
FIG. 2 is a top sectional view, taken on the line 2—2 of FIG. 1, looking in the direction of the arrows, of the furnace portion of the preferred embodiment.
Figure 3:
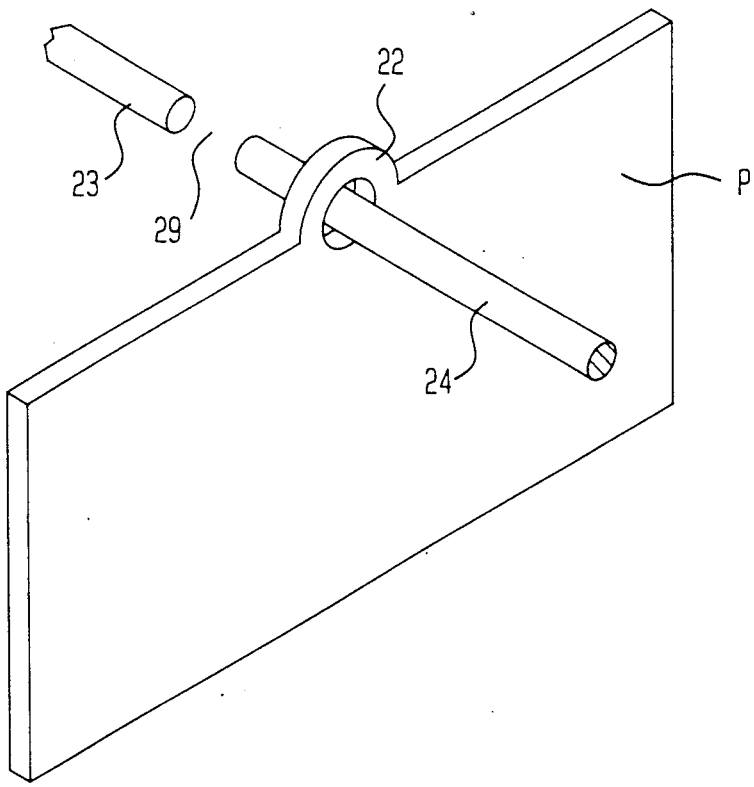
FIG. 3 is a pictorial view of a portion of the device shown in FIG. 1.
Figure 4:
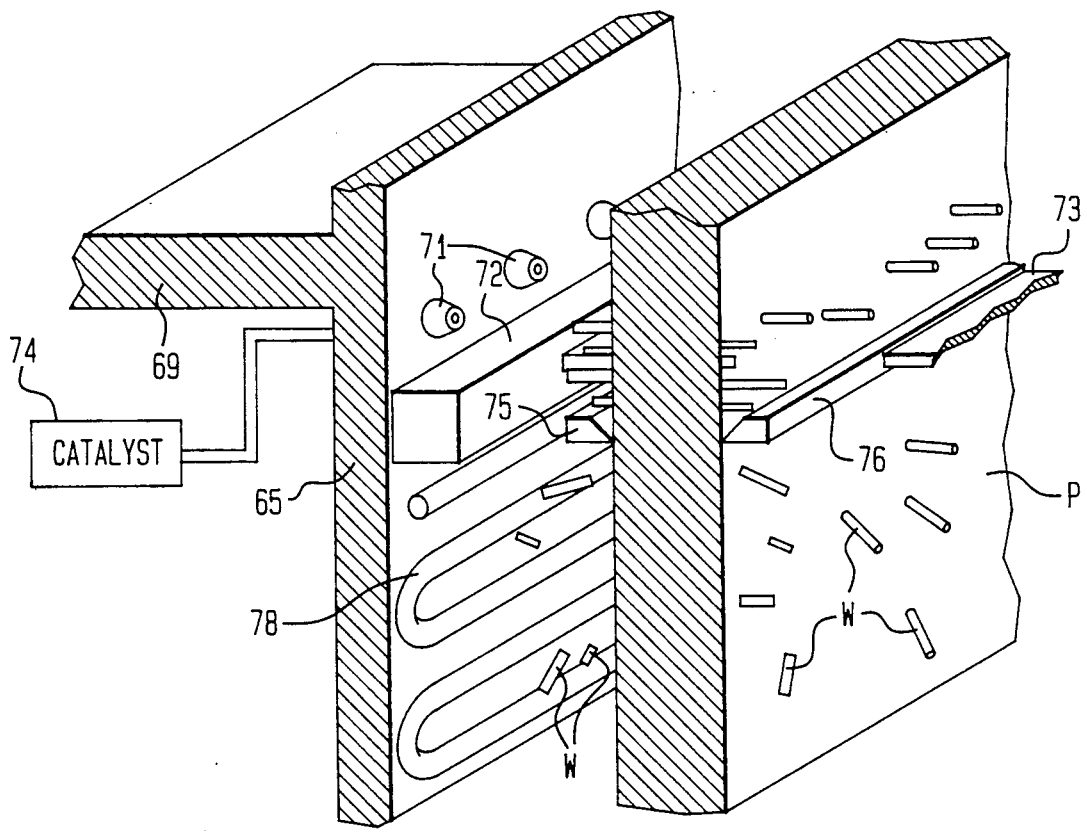
FIG. 4 is a pictorial view of another portion of the device shown in FIG. 1.

Referring now to the drawings there is shown a system 10 for growing ceramic whiskers having a fixed furnace housing 12 that defines a reaction chamber 14 for removably holding a plurality of reaction plates P. A whisker collection apparatus is mounted below chamber 14 and includes a whisker stripping section 18 and a collection hopper 20.

The reaction chamber 14, having a relatively large volume, is capable of holding the flat carbon plates P in parallel, vertical planes. Plates P are generally rectangular in shape and include suspension brackets 22, having an opening to receive suspension rods 23, 24 that are slidably mounted near the upper region of chamber 14 and are driven by a pair of synchronized stepping motors 27, 28, respectively. Rods 23, 24 are arranged colinear and extend through opposite sides of the housing 12. Rods 23, 24 may abut at their ends to form a continuous support for the plates P or they may be separated to form a gap 29 between the spaced ends thereof. Gap 29 is slightly wider than the thickness of a plate P. Motors 27, 28 are synchronized to simultaneously step the rods 23, 24 the same incremental distances in the same direction across the chamber 14 and to then separate the rods 23, 24 to form gap 29 for removal of a particular plate P in a manner to be described below in detail.

Inlet and outlet header plates 30, 31, respectively, are mounted near opposite ends of chamber 14. Plates 30, 31 have vertical guide slots 32 that are vertically aligned to receive the edges of plates P. An array of openings 33 are placed between the slots 32. A manifold plate 36 is located in chamber 14 between the inlet header plate 30 and the side wall of housing 12. Manifold plate 36 has an array of openings 39 distributed over the surface thereof. An inlet fitting 40, mounted on a side wall of housing 12, permits hot reactant vapors to be directed into chamber 14. Openings 39 in plate 36 will disperse the incoming vapors while openings 33 in plate 30 direct vapors into the regions between plates P. Exhaust vapors exit chamber 14 via openings 33 in plate 31 and a fitting 41 mounted in the side wall of housing 12.

The lower portion of housing 12 includes a table enclosure 45 having an elongated rectangular cross-sectional shape. Enclosure 45 houses a flat, moveable table 47 that has an elongated slot 48 that is larger than the cross-sectional dimensions of plates P. A cover plate 49 overlaps the slot 48 and is slidably mounted on the undersurface of table 47 by a motor 60. The plate 49, under the control of motor 60, is used to selectively cover and uncover the slot 48 for the removal of a plate P from the chamber 14. The table 47 acts as an insulating partition between the chamber 14 and the interior of enclosure 45.

Figure 5:
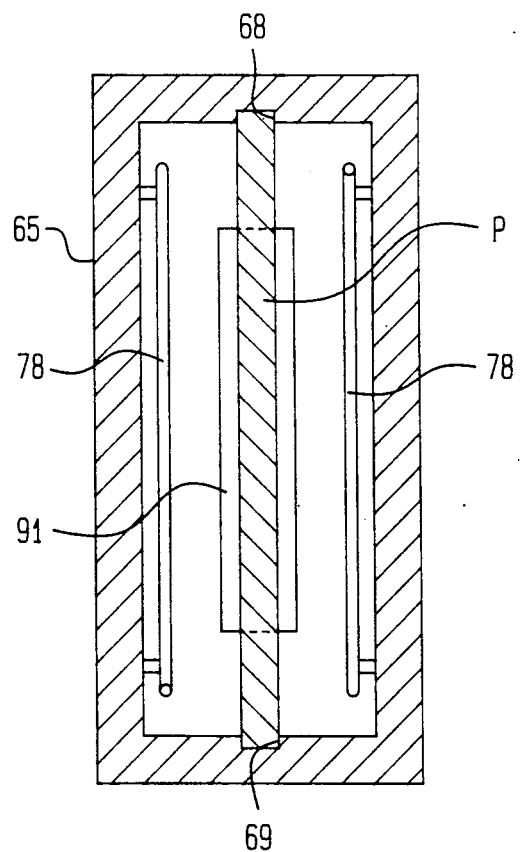
FIG. 5 is a sectional view taken on the line 5—5 of FIG. 1 looking in the direction of the arrows.

The enclosure 45 has a bottom opening 62 into which the upper portion of whisker stripping section 18 extends. Section 18 includes vertical side walls 65 that form a whisker stripping pocket 66. The upper extremities of walls 65 extend through the opening 62 where they are rigidly fixed to the table 47. Cover plate 49 is slidably supported in a slot formed in one side of the upper extremity of wall 65. A pair of vertical slots 68, 69 (FIG. 5) are formed in the walls 65 to receive the edges of a plate P. A horizontal flange 67 is attached to the exterior of walls 65 to provide a tight, slidable cover for sealing the opening 62 while permitting the upper portion of section 18 to move in the opening 62. A stepping motor 70 is mounted on the outside surface of enclosure 45 and includes a shaft that is rigidly attached to the flange 67. The motor 70 is selectively operable to move the combination of the table 47, the stripping section 18 and the hopper 20. This combination is moveable as a unit and may be stepped horizontally to various positions wherein the slot 48 is made to lie directly below one of the plates P such that the slots 68, 69 are coincident with the slots 32 in plates 30, 31.

Whisker strippers 72, 73 are fixed to the inside surfaces of walls 65 below the slot 48. The strippers 72, 73 include elongated stripping heads 75, 76 that may be moved into and out of engagement with opposite surfaces of a plate P in a manner that will be described below in detail. Spray nozzles 71 are mounted in an array just above strippers 72, 73. A catalyst injector 74 communicates with the nozzles 71 for spraying a catalyst into the pocket 66 in the area just above the stripper heads 75, 76.

Also mounted on the inside surface of walls 65 are heating coils 78 that supply heat to the pocket 66. Because the pocket 66 and chamber 14 are to be kept at extremely high temperatures during whisker growth, the walls 65 and the housing 12 must be good thermal insulators. Conventional furnace walls which may consist of several layers of steel, ceramic and insulation are acceptable. The table 47 and cover plate 49 should also be good insulators so as to prevent the escape of heat from the chamber 14.

The hopper 20 includes an inclined floor 80 and a funnelled opening 82 in the top wall 81. The floor 80 includes a hinged trap door 83 which may be rotated to a closed position to retain whiskers W in hopper 20 or it may be rotated to an open position to permit whiskers W to be withdrawn from hopper 20.

A ram 90, having a head 91, extends through the floor 80 and the opening 82. A ram motor 94 is mounted on the outer surface of floor 80 to support and drive ram 90 up and down in the vertical direction.

The operation of the system 10 to produce VLS ceramic whiskers is as follows: Initially, the plates P, preferably made of carbon, are suspended in chamber 14 by the rods 23, 24 which pass through the openings in brackets 22. A whisker-growing atmosphere (gas) at a proper temperature is passed into chamber 14 via fitting 40, openings 39 in manifold plate 36, and openings 33 in plate 30 which evenly distributes the gas over the surface of plates P. After a predetermined time, the plates P are individually removed from chamber 14 for whisker collection.

During whisker collection, the temperature and atmospheric gases of chamber 14 remain in the whisker growing mode. When it is desired to collect whiskers from the plates P, the motor 70 will move the whisker stripping section 18 to a point wherein the slot 48 lies directly below the plate P to be removed. Next the slot 48 is uncovered by having motor 60 withdraw the cover plate 49. At this point, the motor 94 is energized to raise the ram 90 to a point wherein the ram head 91 supports the plate P to be removed. The motors 27, 28 are then operated to move the rods 23, 24 such that the ends form a gap 29 coincident with the plane of the plate P to be removed. The ram 90 is then lowered while supporting the weight of the plate P. The edges of plate P slide into slots 68, 69. Once the ram head 91 is lower than the plane of whisker stripper heads 75, 76, the strippers 72, 73 are energized thereby moving the heads 75, 76 into contact with the plate P. The plate P continues to move downwardly as the stripper heads 75, 76 strip the whiskers W from the plate P. The cover plate 49 can be left in the open position or be moved under slot 48 after the plate P is completely lowered into pocket 66. As seen in FIG. 1, the whiskers W are collected in hopper 20 as they fall through the funneled opening 82.

Replacement of plate P involves the reverse procedure. The cover plate 49 is withdrawn, uncovering the slot 48. The ram 90 is raised by motor 94, pushing plate P back into the chamber 14. The catalyst injector 74 is energized to apply catalyst to the surface of plates P via nozzles 71 as the plate P is moved up into chamber 14. The stripper heads 75, 76 may be in contact with the plate P to remove any whisker fragments that remain. After the stripper heads 75, 76 are withdrawn, the head 91 will fully insert plate P into chamber 14. The motors 27, 28 are then energized to move the support rods 23, 24 through bracket 22 to support the plate P. The ram 90 is then lowered and the cover plate 49 is moved under slot 48.

In the present invention, low cost whisker growth is made possible by employing a multiplicity of relatively large surfaces on which the whiskers are grown in a continuous process. Clearly, the number and size of the plates P may be increased substantially over that shown in the drawings.

Because of the particular construction of the plates P and chamber 14, a number of conventional heating methods are possible. For example, the vapors inputted via fitting 40 may be heated externally, or the plates P may be made of magnetic material and may be heated inductively by a conventional induction heater 51 or the plates P may be made of an electrically resistive material and may be heated by applying a voltage source across plates 30, 31 to pass a current through the plates P. In the latter case, of course, the plates 30, 31 would have to be electrically insulated from each other.

The present system is capable of producing large diameter ceramic whiskers of a uniform diameter and length in a VLS process, the metallic catalysts, such as iron, nickel, cobalt, etc., of finely divided particles being deposited on the plates P via nozzles 71. It is noted that substantially the entire volume of the chamber 14 is being effectively used to produce the whiskers W. Hence, there will be a relatively high efficiency output of whiskers W because there will be little or no furnace volume heated that is not devoted to whisker growing. The process gas passes between the plates P and reacts with the catalyst to form a pool or droplet out of which the whiskers W grow with catalyst particles remaining at the outer end of the whiskers W. By carefully selecting the right size catalyst particle, those skilled in these arts can grow whiskers W of sufficient diameter so that they are free of health risks, making handling of the whiskers W safer and less expensive. Also, by controlling the resident time and temperature in the chamber 14, the length of the whiskers W can be easily controlled. Reactant concentration may be increased in the present system 10 by increasing the pressure in chamber 14. The present system 10 may be operated in either a batch or a continuous mode.

It is further contemplated that the carbon plates P preferably be less than one inch thick. In the interest of raising the productivity within the system 10, thin sheets of carbon matrix-carbon fiber can be used to fabricate plates P. This will further increase the productivity of the system 10 by making still a higher portion of chamber 14 available for the production of ceramic whiskers W. In order to obtain the required rigidity and strength, carbon fiber reinforcements in plates P may be used. In order to assure reasonable life of such plates P, they can be coated (via nozzles 71) with a layer of carbon to meet the process needs for making silicon carbide whiskers W. In this manner, the carbon required for the whisker process is regularly replaced rather than removing carbon from the already thin plates P.

It is further contemplated that the temperature at the exit end of chamber 14 adjacent header plate 31 may be higher than at the entrance end. This temperature gradient will compensate for the lower concentration of reactants at the exit end as components, e.g. SiO and CO, in the process gas react on the surface of the carbon plates P.

Various other modifications are contemplated and may obviously be resorted to by those skilled in the art without departing from the spirit and scope of the invention, as hereinafter defined by the appended claims, as only a preferred embodiment thereof has been disclosed.

What is claimed is:

1. A ceramic whisker growing furnace comprising:
   a furnace chamber;
   a plurality of carbon plates having surfaces, said plates mounted in said chamber and having catalyst particles deposited thereon;
   means for distributing a reactant gas over the surfaces of said plates for causing components in said gas to react with said catalyst particles for growing ceramic whiskers on said plates; and
   means for selectively removing any one of said plates from said chamber while maintaining all of the other of said plates in said chamber.

2. The furnace of claim 1 further including heater means for heating said plates.

3. The furnace of claim 2 wherein said heater means includes an inductive heater.

4. The furnace of claim 2 wherein said heater means includes means for passing an electrical current through said plates and said plates are made of electrical resistive material.

5. A ceramic whisker growing furnace comprising:
   a furnace chamber;
   a plurality of carbon plates having surfaces, said plates mounted in said chamber and having catalyst particles deposited thereon;
   means for distributing a reactant gas over the surfaces of said plates for causing components in said gas to react with said catalyst particles for growing ceramic whiskers on said plates; said means for distributing a reactant gas including an inlet pipe mounted at one end of said chamber, a manifold plate mounted adjacent said inlet pipe and a gas distribution means mounted adjacent said manifold plate; and means for selectively removing said plates from said chamber.

6. The furnace of claim 5 wherein the surfaces of said plates are aligned in parallel, vertical planes.

7. The furnace of claim 5 wherein said gas distribution means includes first and second spaced header plates having a plurality of vertical grooves therein and wherein said carbon plates are mounted in said grooves with the surfaces thereof in parallel, vertical alignment.

8. The furnace of claim 7 wherein at least one of said header plates has a plurality of openings therein for permitting said reactant gases to be distributed evenly over the surfaces of said carbon plates.

9. A ceramic whisker growing system comprising:
a plurality of ceramic whisker growing plates having surfaces with catalyst particles thereon;
a ceramic furnace means for holding said plates in spaced relationship with each other;
means for heating said plates;
means for distributing a reactant gas over the surfaces of said plates for causing components in said gas to react with said catalyst particles for growing ceramic whiskers on said plates;
means for selectively removing any one of said plates from said furnace means while maintaining the other of said plates in said furnace means and for replacing said plates to said furnace means; and
means for removing ceramic whiskers from said surface of said plates as said plates are removed from said furnace means.

10. A ceramic whisker growing system comprising:
a plurality of ceramic whisker growing plates having surfaces with catalyst particles thereon;
a ceramic furnace means for holding said plates in spaced relationship with each other;
means for heating said plates;
means for distributing a reactant gas over the surfaces of said plates for causing components in said gas to react with said catalyst particles for growing ceramic whiskers on said plates;
means for selectively removing said plates from said furnace means and for replacing said plates to said furnace means;
means for removing ceramic whiskers from said surface of said plates as said plates are removed from said furnace means; and
means for applying said catalyst particles to the surface of said plates as the plates are returned to said furnace means.

11. The system of claim 10 wherein the surfaces of said plates are aligned in parallel, vertical planes.

12. The system of claim 11 wherein said means for distributing a reactant gas includes first and second spaced header plates having a plurality of vertical grooves therein and wherein said carbon plates are mounted in said grooves with the surfaces thereof in parallel, vertical alignment.

13. The system of claim 12 wherein at least one of said header plates has a plurality of openings therein for permitting said reactant gases to be distributed evenly over the surfaces of said carbon plates.

14. The system of claim 11 wherein said means for selectively removing said plates includes means for supporting one of said plates and moving said plates out of and into said furnace along a path.

15. The system of claim 14 wherein said means for removing ceramic whiskers includes strippers having blades mounted adjacent said path and including means for moving said blades into substantial contact with said surfaces as said plates are moving out of said furnace means for stripping whiskers from said surfaces.

16. The system of claim 15 wherein said means for removing whiskers includes a hopper for catching whiskers being stripped from said surfaces.

17. The system of claim 14 further including means for applying catalyst particles to the surfaces of said plates as said plates are moving into said furnace means.

* * * * *